United States Patent
Namba

(10) Patent No.: US 6,645,692 B2
(45) Date of Patent: Nov. 11, 2003

(54) PHOTORESIST COMPOSITION

(75) Inventor: Katsuhiko Namba, Hirakata (JP)

(73) Assignee: Sumitomo Chemical Company, Limited, Osaka (JP)

(*) Notice: Subject to any disclaimer, the term of this patent is extended or adjusted under 35 U.S.C. 154(b) by 0 days.

(21) Appl. No.: 09/882,049

(22) Filed: Jun. 18, 2001

(65) Prior Publication Data

US 2002/0012874 A1 Jan. 31, 2002

(30) Foreign Application Priority Data

Jun. 20, 2000 (JP) .......................................... 2000-184169

(51) Int. Cl.⁷ ............................................... G03F 7/004
(52) U.S. Cl. ..................................... 430/270.1; 430/905
(58) Field of Search ............................. 430/270.1, 325, 430/326, 907, 914, 905

(56) References Cited

U.S. PATENT DOCUMENTS

| | | | | |
|---|---|---|---|---|
| 5,340,697 A | * | 8/1994 | Yoshimoto et al. | ...... 430/270.1 |
| 6,083,658 A | * | 7/2000 | Kunita et al. | ............ 430/270.1 |
| 6,156,860 A | | 12/2000 | Tanaka et al. | ............... 526/245 |
| 6,265,135 B1 | * | 7/2001 | Kodama et al. | ......... 430/286.1 |

FOREIGN PATENT DOCUMENTS

| JP | 07-021626 | 3/1995 |
|---|---|---|
| JP | 08-062834 | 3/1996 |

* cited by examiner

*Primary Examiner*—Rosemary Ashton
(74) *Attorney, Agent, or Firm*—Birch, Stewart, Kolasch & Birch, LLP

(57) ABSTRACT

A photoresist composition comprising a binder component, an acid generator and a surface active agent containing fluorine atom(s) is provided, and the photoresist composition reduces development deficiency generated at the time of development significantly without lowering the resolution, the profile, or the like. The surface active agent is poly trifluorobutyl methyl siloxane.

4 Claims, No Drawings

PHOTORESIST COMPOSITION

BACKGROUND OF THE INVENTION

The present invention relates to a photoresist composition suitable for lithography utilizing a high energy radiation such as far ultraviolet rays (including excimer laser, or the like), an electron beam, X-rays or a radiation.

In recent years, with the increase in the higher integration of integrated circuits (IC), a pattern formation of a quarter of a micron has been in demand. In response to this demand, excimer laser lithography that allows the fabrication of 64M DRAMs and 256M DRAMs has drawn attention. As a resist suitable for this excimer laser lithography process, a so-called chemical amplifying type photoresist that utilizes an acid catalyst and a chemical amplifying effect has been progressively adopted. The chemical amplifying type photoresist changes its solubility to an alkaline developer in the irradiated portion through a reaction using the acid generated from the acid generator by the radiation, as a catalyst, thereby gives a positive type or a negative type pattern.

Then, under the circumstances where the miniaturization of process dimensions is progressing rapidly corresponding to the increase in the degree of integration of semiconductor integrated circuits, the demand for the minute processing related to the above described chemical amplifying type resist has greatly increased. In the case of a chemical amplifying type positive resist, it is generally said that the larger the ratio of acid unstable groups to the resin in the resist composition (protection ratio), the greater the contrast and the greater the resolution. When the protection ratio of the resin increases, however, the hydrophobic property of the resist coating film increases and wettability of the developer deteriorates so that development deficiency occurs very often. The faulty development will damage circuit patterns in the minute processing steps and provide a factor that decreases the yield of manufacture of semiconductors.

The object of the present invention is to provide a photoresist composition that does not allow development deficiency to occur while, at the same time, maintaining excellent resist performances such as sensitivity, resolution, heat resistance, remaining film thickness, coatability and pattern profile.

The present inventor has conducted extensive studies in order to achieve the above object, and, as the result, has found that a resist with reduced development deficiency can be obtained by incorporating a specific surface active agent having fluorine atom(s) into photoresist composition.

SUMMARY OF THE INVENTION

The present invention provides a photoresist composition excellent in practical use which comprises a binder component, an acid generator and a surface active agent containing fluorine atom(s).

EMBODIMENT OF THE INVENTION

The present invention is characterized by using a fluorine-containing surface active agent as a development deficiency suppression agent. Among fluorine-containing surface active agents a polymer containing a fluorinated alkyl group and a silicone group is preferably used. Specifically, a fluorine-containing surface active agent represented in the following formula (I) can be mentioned:

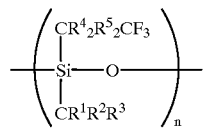

(I)

wherein $R^1$ to $R^5$ independently represent hydrogen atom, a fluorine atom, an alkyl group having from 1 to 4 carbon atoms or a cyclo-alkyl group having from 5 to 7 carbon atoms, respectively, and n is an integer from 10 to 10000.

Here, examples of the alkyl group having from 1 to 4 carbon atoms include methyl, ethyl, propyl, i-propyl, butyl, i-butyl, and sec-butyl. Examples of the cyclo-alkyl group having from 5 to 7 carbon atoms include cyclopentyl, cyclohexyl, and cycloheptyl. Further, n is preferably, from 100 to 1000. A commercially available fluorine-containing surface active agent such as "FS-1265" (made by Toray Silicone Co. Ltd. ) can be used. One kind of the fluorine-containing surface active agent may be used singly, or two or more kinds may be used in combination in the photoresist composition of the present invention.

Although the content of the surface active agent in the composition of the present invention can be appropriately selected according to the kinds of fluorine-containing surface active agent and the kinds of photoresist compositions, 1 ppm to 100 ppm based on the total weight of the composition and, preferably, 10 ppm to 100 ppm, is usually acceptable in the composition. When the content is too large, decrease in the effect for reducing development deficiency tends to occur. In the case when the content is too small, it leads to an insufficient reduction of development deficiency whereby an uneven application is generated. Furthermore, a silicon-containing surface active agent or a hydrocarbon-containing surface active agent may be used in addition to the fluorine-containing surface active agent of the present invention as long as the effect of the present invention is not adversely affected.

In addition, as for a binder component in the present invention, generally an alkaline soluble resin or a resin that can become alkaline soluble is utilized. The acid generator generates acid by irradiation and the chemical amplifying type positive resist utilizes the catalytic function of the generated acid. That is to say, the acid generated in the irradiated portion diffuses in the successive heat processing (post exposure bake) and cleaves the protection groups of the resin, etc., thereby converting the irradiated portion into alkaline soluble. Chemical amplifying type positive resists include, for example, following types:

(1) a chemical amplifying type positive resist which comprises a binder resin which is alkaline soluble; an acid generator; and a dissolution inhibitor which has a protection group cleavable due to the acid and has a dissolving suppression function to the alkaline soluble binder resin but loses the dissolving suppression function after the above protection group is cleaved due to the acid.

(2) a chemical amplifying type positive resist which comprises an acid generator; and a binder resin which has a protection group cleavable due to acid, and is insoluble or difficult to be dissolved in alkaline solution, but converts into an alkaline soluble substance after the above described protection group is cleaved due to acid.

In addition, the chemical amplifying type photoresist of negative type generally contains a alkaline soluble binder resin and a cross-linking agent and a radiation sensitive component. In such a negative resist acid generated in an irradiated portion diffuses through the successive heat processing and acts on the cross-linking agent so as to cure and convert the binder resin in the irradiated portion into a non-alkaline soluble material.

Examples of the binder resin which is inherently alkaline soluble and used in the chemical amplifying type positive resist include an alkaline soluble resin having a phenol structure and an alkaline soluble resin that has (meth) acrylate structure and has an alicyclic ring and carboxyl groups on the alcohol side of the ester. Specific example thereof include a polyvinylphenol resin, polyisopropenylphenol resin, a polyvinylphenol resin or polyisopropenylphenol resin wherein a portion of the hydroxide group is alkyl-etherificated, a copolymer resin of vinylphenol or iso-propenyl phenol with other polymerizable unsaturated compound, a polymer of an alicyclic ester of (meth) acrylic acid having carboxyl group(s) in the alicyclic ring thereof, and a copolymer of an alicyclic ester of (meth) acrylic acid and (meth)acrylic acid.

When such a resin being inherently alkaline soluble is used as a binder component, a dissolution inhibitor is used. The dissolution inhibitor can be a compound of which the phenolic hydroxide group is protected with a group that has a dissolving suppression function against an alkaline developer and that is cleaved by the acid. Examples of the group which is cleaved by an acid include the tert-butoxycarbonyl group can be cited and this is replaced with a hydrogen in a phenolic hydroxide group. The dissolution inhibitor includes, for example, 2,2-bis(4-tert-butoxycarbonyl oxyphenyl)propane, bis(4-tert-butoxycarbonyl oxyphenyl) sulfone, 3,5-bis(4-tert-butoxycarbonyl oxyphenyl)-1,1,3-trimethyl indan, and the like.

The binder resin, which has an acid-cleavable protection group and is inherently insoluble or difficult to be dissolved, and is capable of being soluble in an alkaline medium after cleavage of the protection group by the action of an acid, can be obtained by introducing protection groups that can be cleaved by the acid to an alkaline soluble resin, such as the above exemplified resin having a phenol structure or a (meth)acrylic acid structure. Such groups that have a dissolving suppression function against alkaline developer and that are unstable against acid can be a variety of well known protective groups. Examples of the protective group include groups of which the quarternary carbon atom is connected to an oxygen atom, such as tert-butyl, tert-butoxycarbonyl and tert-butoxycarbonylmethyl; acetal type groups such as tetrahydro-2-pyranyl, tetrahydro-2-furyl, 1-ethoxyethyl, 1-(2-methylpropoxy)ethyl, 1-(2-methoxyethoxy)ethyl, 1-(2-acetoxyethoxy)ethyl, 1-[2-(1-adamantyloxy)ethoxy]ethyl and 1-[2-(1-adamantan carbonyloxy)ethoxy]ethyl; residue of non-aromatic cyclic compound such as 3-oxocyclohexyl, 4-methyltetrahydro-2-pyran-4-yl (introduced from mevalonic lactone) and 2-methyl-2-adamantyl. These groups are replaced with a hydrogen of the phenolic hydroxyl group or a hydrogen of a carboxyl group. These protection groups can be introduced into an alkaline soluble resin that has a phenolic hydroxyl group or a carboxyl group through a well known protection group introduction reaction. In addition, the above described resins can be obtained by a copolymerization using an unsaturated compound having such a group, as one monomer.

In the case of the chemical amplifying type negative resist, a resin being inherently alkaline soluble acts as a binder component A variety of alkaline soluble resins, as exemplified in the above chemical amplifying type positive resist, can be used as a binder resin for chemical amplifying type negative resist. The resist of negative type contains a cross-linking agent in addition to a binder component and a radiation sensitive component. The cross-linking agent cross-links and cures the binder resin by responding to the action of the acid generated in the irradiated portion by the radiation. Usually, a compound having a methylol group, or its alkyl ether derivative(s), may be used as the cross-linking agent. Specific examples thereof include methylol melamine or its alkyl ether derivative(s) such as hexamethylol melamine, pentamethylol melamine, tetramethylol melamine, hexamethoxy methyl melamine, pentamethoxymethyl melamine and tetramethoxy methyl melamine, methylol benzoguanamine or an alkyl ether thereof such as tetramethylol benzoguanamine, tetramethoxy methyl benzoguanamine and trimethoxy methyl benzoguamine, 2,6-bis(hydroxymethyl)4-methylphenol or an alkyl ether thereof, 4-tert-butyl-2,6-bis(hydroxymethyl) phenol or an alkyl ether thereof, 5-ethyl-1,3-bis (hydroxymethyl)perhydro-1,3,5-triazine-2-o n (generally referred to as N-ethyl di-methylol tri-azone) or an alkyl ether thereof, N,N-dimethylol urea or a di-alkyl ether thereof, 3,5-bis(hydroxymethyl)perhydro-1,3,5-oxadiazine-4-on (gene rally referred to as di-methylol uron) or an alkyl ether thereof, and tetramethylol glyoxal diurane or a tetramethyl ether thereof.

A chemical amplifying type resist that uses one of the above described resins, which is alkaline soluble or can become alkaline soluble, comprises an acid generator that generates an acid by irradiation. The acid generator is one of a variety of compounds that generates acid by irradiating the substance or the resist compound containg the substance, with radiation. The acid generator may be a kind of compound or a mixture of two or more kinds of the compounds. For example, onium salts, organic halogen compounds, compounds having a diazomethane disulfonyl structure, disulfone compounds, ortho-quinone azide compounds and sulfonic acid compounds can be exemplified. In the present invention, as such an acid generator, compounds having a diazomethane disulfonyl structure, disulfone compounds, sulfonic acid compounds, and the like, are favorably used. Examples of the sulfonic acid compounds usable as an acid generator include ester of alkyl sulfonic acid, ester of halo-alkyl sulfonic acid, an ester of aryl sulfonic acid and an ester of camphor sulfonic acid. As for an alcoholic component forming the esters, pyrogallols, 2-or 4-nitrobenzyl alcohols, 2,6-di-dinitrobenzyl alcohols, N-hydroxy imide compounds and oxime compounds can be exemplified.

Compounds that have diazomethane disufonyl structure include, for example, bis(cyclohexyl sulfonyl) diazomethane, bis(phenyl sulfonyl)diazomethane, bis(p-tolyl sulfonyl)diazomethane, bis(2,4-xylyl sulfonyl) diazomethane, and the like. Examples of the disulfone compounds include diphenyl disulfone, di-p-tryl disulfone, phenyl p-tryl disulfone, and phenyl p-methoxy phenyl disulfone. Examples of the onium salts include 4-methyl phenyl diphenyl sulfonium 4-methyl benzene sulfonate, 4-methyl phenyl diphenyl sulfonium, and trifluoro methane sulfonate.

Examples of the sulfone acid compounds include N-(phenyl sulfonyl-oxy)succinimide, N-(methyl sulfonyl-oxy)succinimide, N-(trifluoromethyl sulfonyl-oxy) succinimide, N-(butyl sulfonyl-oxy)succinimide, N-(10-camphor sulfonyl-oxy)succinimide, N-(trifluoromethyl sulfonyl-oxy)phthalimide, N-(trifluoromethyl sulfonyl-oxy) naphthylimide, 2-nitrobenzyl p-toluene sulfonate, 4-nitro benzyl p-toluene sulfonate, 2,6-di-nitrobenzyl p-toluene sulfonate, 1,2,3-benzene-tolyl trismethane sulfonate, 1-benzyl-1-phenylmethyl p-toluene sulfonate (generally referred to as benzoin tosylate), 2-benzoyl-2-hydroxy-2-phenylethyl p-toluene sulfonate (generally referred to as á-methylolbenzoin tosylate), and á-(p-tolylsulfonate oxiimino)-4-methoxy phenyl acetonitrile.

In particular, bis(cyclohexyl sulfonyl)diazomethane, having a diazomethane disulfonyl structure, gives a good resolution and gives an extremely good profile shape, which is rectangular. In addition, 4-methyl phenyl diphenyl sulfonium 4-methylbenzene sulfonate, an onium salt, generates p-toluene sulfonic acid, which is a strong acid and causes extremely high sensitivity. At present, it is understood that the roughness of the profile can be improved by increasing the amount of quencher described in the following. Therefore, the addition of onium salt is extremely effective as a method for improving the problem of low sensitivity due to the increased amount of the quencher, a basic component.

That is to say, two kinds of acid generators of bis(cyclohexyl sulfonyl)diazomethane and 4-methylphenyl diphenyl sulfomium 4-methyl benzene sulfonate are utilized and the amount of quencher can be increased, thereby, the roughness is remarkably improved and furthermore, the focal depth can be enlarged.

In the present invention the resist composition may comprise a base for functioning as a quencher. That is to say, it is known that the chemical amplifying type resist has a so-called time delay effect wherein the performance changes because of the loss of the activity of the acid generated in the resist due to a trace of ammonium or amines that exist in the environmental atmosphere, during the time when it is left alone from the time of irradiation to the subsequent heat processing (post-exposure bake, hereinafter referred to as PEB). The basic compound can be used in order to prevent such a loss of the activity of the acid. In order to exercise the effect by remaining in the resist film formed on the substrate even after the pre-bake of the resist film, it is preferable for this basic compound not to evaporate at the temperature of pre-baking and. In general, the basic compound that has a boiling point of 150° C. or more, is used.

The base may be a compound having, for example, the primary, secondary or tertiary amino group. Specific examples thereof include compounds represented by the following formulas:

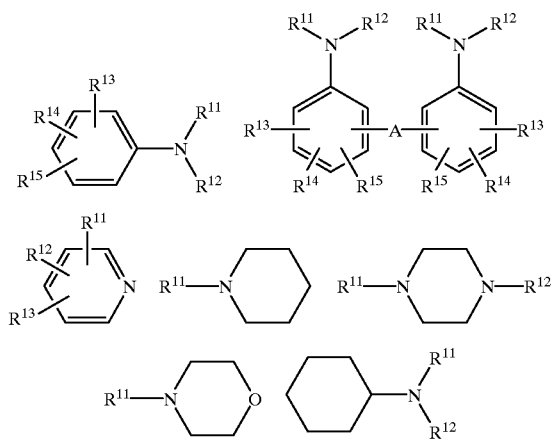

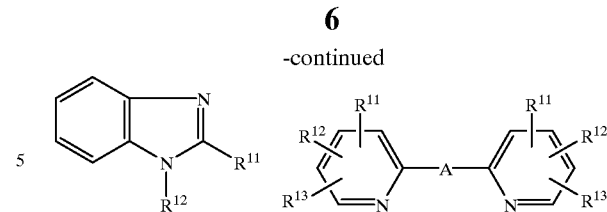

wherein $R^{11}$, $R^{12}$, $R^{13}$, $R^{14}$ and $R^{15}$ independently represent alkyl, cycloalkyl, aryl or alkoxi which may be replaced with, respectively, hydrogen or the hydroxyl group and A represents alkylene, carbonyl or imino. Alkyl and alkoxi represented by $R^{11}$ to $R^{15}$ can have approximately 1 to 6 carbon atoms, cycloalkyl can have approximately 5 to 10 carbon atoms, and the aryl can have approximately 6 to 10 carbon atoms. Alkylene represented by A may have approximately 1 to 6 carbon atoms, which may be a straight chain or a branched chain. Among such basic compounds, the 2,6-di-alkylpyridine compound represented by the following formula (X) is effective for increasing the chronological stability of the resist.

(X)

wherein $R^{21}$ and $R^{22}$ independently represent alkyls having from 1 to 4 carbon atoms. As specific examples of 2,6-di-alkyl pyridine compounds, 2,6-lutidine, 2-ethyl-6-methyl pyridine and 2,6-di-tert-butyl pyridine can be exemplified. This 2,6-di-alkyl pyridine compound can be used alone as a quencher or can also be used in combination with other basic compounds, if so desired.

As for a favorable composition ratio of the chemical amplifying type photoresist composition, the acid generator is in the range of 0.02 to 40 parts by weight per 100 parts by weight of resin. In the case of the negative resist, the cross-linking agent is comprised preferably in the range of 1 to 60 parts by weight. When the basic compound is comprised, it is comprised preferably in the range of 0.01 to 20 parts by weight. Other components, such as dissolution inhibitor, sensitizer, dye, adhesion improvement agent, electron donor, water retention agent, and a variety of other additives that are in common use in this field, can further be comprised if necessary. By adding water retention agent, water, which is necessary for a chemical amplifying reaction, can be maintained. In the case that these additives are used, the amounts used range up to approximately 40 parts by weight per 100 parts by weight of resin, as a whole.

The above-mentioned components of the resist composition of the present invention are dissolved in a solvent so that the total solid content is 10–50% by weight, and a resist solution is prepared.

The solvent herein used may be one which dissolves each component, and can be one which is generally used in this field. Examples thereof include glycol ether esters such as ethylcellosolve acetate, methylcellosolve acetate, propylene glycol monomethyl ether acetate and propylene glycol monoethyl ether acetate; glycol mono- or di-ethers such as ethylcellosolve, methylcellosolve, propylene glycol monomethyl ether, propylene glycol monoethyl ether and dietylene glycol dimethyl ether; esters such as ethyl lactate, butyl acetate and ethyl pyruvate; ketones such as methyl isobutyl ketone, 2-heptanone, and cyclohexanone; and aromatic hydrocarbons such as xylene. These solvents can be used alone or in combination of two or more thereof.

The photoresist composition obtained in the above manner according to the present invention forms a resist film by application to a substrate such as a silicon wafer. Usually, through the subsequent steps of pre-baking, patterning light exposure, PEB and development by means of alkaline developer a positive or negative type of pattern is formed.

Next, though the present invention is described in more detail by examples. The present invention is not at all limited by these examples. In the examples, % and part representing the content or the amount are weight basis, unless stated otherwise.

Synthetic Example 1

Partial Ethoxyethylation of Poly-vinylphenol

Into a flask were charged 40.0 g of poly(p-vinylphenol) (0.33 mol in the unit of p-vinylphenol), 0.052 g of p-toluene sulfonic acid monohydrate and 480 g of propylene glycol monomethylether acetate. The resulting mixture was stirred and, then, concentrated under a reduced pressure of 20 torr at 65° C. 194 g of resin solution obtained after concentration was cooled to 20° C. and 8.3 g of ethyl vinylether (0.12 mol; 0.35 equivalents to the hydroxyl group of poly(p-vinylphenol) was added dropwise thereto by using a dropping funnel. After stirring for three hours at 25° C., 320 g of methyl isobutyl ketone, 87 g of propylene glycol monomethyl ether acetate and 200 g of ion exchanged water were added and a separation was conducted. The obtained organic layer was washed three times with 200 g of ion-exchanged water and a separation of the solution was conducted. After the solvent was distilled out of the organic layer and the resulting solution was concentrated. Then 330 g of propylene glycol monomethylether acetate was added and the solvent is further distilled out, thereby, the solvent was replaced so as to obtain 140 g of propylene glycol monomethyl ether acetate solution of the resin.

The solid concentration of this resin solution was measured by an evaporation to dryness, and was found to be 28.9%. The ratio of 1-ethoxyethylated hydroxyl groups in the poly(p-vinylphenol) was determined by NMR spectrometer and was found to be 41.7%.

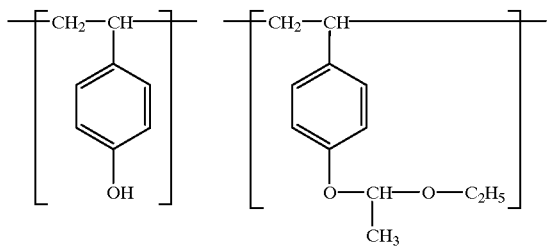

Synthetic Example 2

Except that the amount of ethyl vinylether was changed, same procedure as in Synthetic Example 1 was conducted to obtain propylene glycol monomethyl ether acetate solution of the resin.

The solid concentration of this resin solution was measured by an evaporation to dryness, and was found to be 29.8%. The ratio of 1-ethoxyethylated hydroxyl groups in the poly(p-vinylphenol) was determined by NMR spectrometer and was found to be 29.7%.

EXAMPLE 1

A solution is prepared by mixing resin solution obtained as Synthetic Examples 1 and 2 at the ratio, converted to the solid content, of 85.8/14.2 so that the mean protection ratio exhibits the value of 40. 0.5 part of bis(cyclohexyl sulfonyl) diazomethane and 0.012 part of dicyclohexylmethyl amine as the acid generator, 0.135 part of PPG (polypropylene glycol) as the water holding agent, propylene glycol mono methylether acetate, which amount was 60 parts in total including the portion coming from the resin solution, and the above resin which amount, converted to the solid content, was 60 parts 13.5 parts, were mixed. This solution was filtered through a fluorinated resin filter having pore diameter of 0.1 ìm in order to prepare a resist solution. To this, 50 ppm of poly-trifluorobutyl methyl siloxane were added and the solution was filtered through a filter made of fluorinated resin having a pore diameter of 0.1 ìm to prepare to a resist solution.

EXAMPLE 2

A resist solution was prepared according to the same procedure as in Example 1, except that the amount of poly-trifluorobutyl methyl siloxane was changed to 20 ppm.

Comparative Example

A resist solution was prepared according to the same procedure as in Example 1, except that poly-trifluorobutyl methyl siloxane was not added.

Reference Example 1

(1) The above described resist solution was applied on a silicon wafer, which had been washed according to a conventional method, by using a spin coater so that the film thickness after drying was 0.56 ìm (refractive index: 1.555). Then, the silicon wafer was pre-baked for 60 seconds at 90° C. on a hotplate. The application film after pre-baking was subjected to an exposure through a chromium mask which could transcript the hole pattern of 1:2 by using a stepper with a KrF excimer laser having the exposure light wavelength of 248 nm ["NSR-2205 EX12B," NA=0.55, ò=0.8 made by Nikon] while the amount of exposure light was stepwise varied. The PEB was carried out by heating the wafer after the light exposure for 60 seconds at 105° C. on a hotplate so that the cleaving reaction of the protection groups occurs in the light exposure portion. This was developed by a solution of 2.38% of tetramethyl ammonium hydroxide and a positive type pattern was obtained.

The formed pattern was observed through an electron microscope so as to evaluate the effective sensitivity, the focus depth and the profile and the results thereof are shown in Table 1.

TABLE 1

| Sample | Sensitivity | Resolution | Focus depth | Profile |
|---|---|---|---|---|
| Example 1 | 48 mJ | 0.22 ìm | 0.8 ìm | good |
| Example 2 | 48 mJ | 0.22 ìm | 0.8 ìm | good |
| Comparative example 1 | 48 mJ | 0.22 ìm | 0.8 ìm | good |

Effective sensitivity: represented by the minimum exposure amount when the size of the hole diameter in the cross section becomes precisely 0.25 ìm in the hole pattern of 0.25 ìm 1:2.

Focus Depth: represented by the range of focus where the pattern of the hole diameter 0.25 ìm 1:2 is resolved when exposed at the effective sensitivity while the position of the focus is shifted upward and downward.

Profile: determined by the cross sectional shapes of the pattern formed when exposed at the effective sensitivity.

As observed in these results, the performance concerning the pattern formation has not changed even in the case that a development deficiency suppression agent was added to the resist.

(2) The above described resist solution is applied on a silicon wafer (4-inches), which has been washed according to a conventional method, by using a spin coater so that the film thickness after drying becomes 0.56 ìm (refractive index: 1.555). Then, this silicon wafer is pre-baked for 60 seconds at 90° C. on a hotplate. This wafer is measured by Surfscan 5500 (manufactured by KLA-Tencor Co.) and the number of deficiency (0.5 ìm or larger) is counted (number of deficiency-1). After that, the measured wafer is heated on a hotplate for 60 seconds at 105° C. (PEB) and then this is developed by a solution of 2.38% of tetramethyl ammoniumhydroxide. After that, the wafer is measured by Surfscan 5500 so that the number of deficiency (0.5 ìm or larger) is counted (number of deficiency-2). The increased number of the deficiency which is the difference between the number of deficiency-1 and the number of deficiency-2 is assumed to be the number of development deficiency. These results are shown in Table 2.

TABLE 2

| Sample | Number of deficiency – 1 | Number of deficiency – 2 | Increased number of deficiency |
|---|---|---|---|
| Example 1 | 5 | 7 | 2 |
| Example 2 | 2 | 2 | 0 |
| Comparative example 3 | 11 | 92 | 81 |

As is observed in Table 3, the increased number of deficiency after and the development was reduced to a great extent by adding a development deficiency suppression agent according to the present invention.

According to the present invention, the surface activation agent, which includes fluorine atoms, is incorporated in a photoresist composition, thereby the development deficiency generated at the time of development can be significantly reduced without lowering the resolution, the profile, or the like. Accordingly, by using this composition, a highly precise microscopic photoresist pattern can be formed with a good yield.

What is claimed is:

1. A photoresist composition comprising a binder component, an acid generator and poly-trifluorobutyl methyl siloxane as a surface active agent containing fluorine atom(s).

2. The photoresist composition according to claim 1 which further comprises a quencher.

3. The photoresist composition according to claim 1 which is positive type and wherein the binder component comprises a resin having an acid-cleavable group.

4. The photoresist composition according to claim 1 which is negative type and further comprises cross-linking agent, and wherein the binder component comprises a resin being inherently alkaline soluble.

* * * * *